US008878250B2

(12) United States Patent
Hata et al.

(10) Patent No.: US 8,878,250 B2
(45) Date of Patent: Nov. 4, 2014

(54) ELECTRONIC DEVICE AND METHOD FOR PRODUCING ELECTRONIC DEVICE

(75) Inventors: Masahiko Hata, Tsuchiura (JP);
Sadanori Yamanaka, Chiba (JP);
Tomoyuki Takada, Tsukuba (JP);
Kazuhiko Honjo, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 74 days.

(21) Appl. No.: 13/594,442

(22) Filed: Aug. 24, 2012

(65) Prior Publication Data
US 2012/0319170 A1 Dec. 20, 2012

Related U.S. Application Data

(63) Continuation-in-part of application No. PCT/JP2011/000991, filed on Feb. 22, 2011.

(30) Foreign Application Priority Data

Feb. 26, 2010 (JP) ................................ 2010-042609

(51) Int. Cl.
*H01L 29/737* (2006.01)
*H01L 23/31* (2006.01)
*H01L 27/06* (2006.01)
*H01L 23/00* (2006.01)

(52) U.S. Cl.
CPC ... *H01L 27/0605* (2013.01); *H01L 2924/01023* (2013.01); *H01L 23/3192* (2013.01);
(Continued)

(58) Field of Classification Search
CPC .................. H01L 21/02381; H01L 23/3121; H01L 23/3171; H01L 23/3192; H01L 27/0605; H01L 27/1211
See application file for complete search history.

(56) References Cited

U.S. PATENT DOCUMENTS

| 4,774,205 A | 9/1988 | Choi et al. |
| 6,265,246 B1 | 7/2001 | Ruby et al. |

(Continued)

FOREIGN PATENT DOCUMENTS

| JP | 60-257162 A | 12/1985 |
| JP | 63-18661 A | 1/1988 |

(Continued)

OTHER PUBLICATIONS

Translation of the International Preliminary Report on Patentability and Written Opinion of the International Searching Authority dated Sep. 27, 2012 for International Appln. No. PCT/JP2011/000991 to Sumitomo Chemical Co., Ltd.

(Continued)

*Primary Examiner* — Minh-Loan Tran
*Assistant Examiner* — Fazli Erdem
(74) *Attorney, Agent, or Firm* — Sughrue Mion, PLLC

(57) ABSTRACT

Electronic device is provided, including: a base wafer whose surface is made of silicon crystal; a Group 3-5 compound semiconductor crystal formed directly or indirectly on partial region of the silicon crystal; an electronic element including a portion of the Group 3-5 compound semiconductor crystal as active layer; an insulating film formed directly or indirectly on the base wafer and covering the electronic element; an electrode formed directly or indirectly on the insulating film; a first coupling wiring extending through the insulating film, having at least a portion thereof formed directly or indirectly on the insulating film, and electrically coupling the electronic element with the electrode; a passive element formed directly or indirectly on the insulating film; a second coupling wiring extending through the insulating film, having at least a portion thereof formed directly or indirectly on the insulating film, and electrically coupling the electronic element with the passive element.

9 Claims, 2 Drawing Sheets

(52) U.S. Cl.
CPC ............... *H01L 2924/01013* (2013.01); *H01L 2924/10336* (2013.01); *H01L 2224/94* (2013.01); *H01L 2924/01033* (2013.01); *H01L 2924/01005* (2013.01); *H01L 2924/01029* (2013.01); *H01L 24/13* (2013.01); *H01L 2224/05569* (2013.01); *H01L 2924/01004* (2013.01); *H01L 2924/01006* (2013.01); *H01L 24/05* (2013.01); *H01L 23/3121* (2013.01); *H01L 23/3171* (2013.01); *H01L 2924/10329* (2013.01); *H01L 2224/13023* (2013.01); *H01L 2924/01074* (2013.01); *H01L 2924/01082* (2013.01); *H01L 2924/01032* (2013.01); *H01L 24/03* (2013.01); *H01L 224/05571* (2013.01)
USPC .............. 257/197; 257/21; 257/80; 257/183; 257/200; 257/E29.188

(56) References Cited

U.S. PATENT DOCUMENTS

| | | | |
|---|---|---|---|
| 6,376,280 | B1 | 4/2002 | Ruby et al. |
| 2003/0006415 | A1 | 1/2003 | Yokogawa et al. |
| 2003/0107060 | A1 | 6/2003 | Ota et al. |
| 2011/0006343 | A1* | 1/2011 | Hata et al. ................ 257/183 |
| 2011/0006368 | A1* | 1/2011 | Hata et al. ................ 257/347 |
| 2011/0018030 | A1* | 1/2011 | Takada et al. ............. 257/190 |
| 2011/0316051 | A1* | 12/2011 | Takada et al. ............. 257/200 |
| 2012/0061730 | A1* | 3/2012 | Yamanaka et al. ........ 257/197 |
| 2012/0319171 | A1* | 12/2012 | Takada et al. ............. 257/200 |

FOREIGN PATENT DOCUMENTS

| | | | |
|---|---|---|---|
| JP | 5-13584 | A | 1/1993 |
| JP | 6-232126 | A | 8/1994 |
| JP | H08-115922 | A | 5/1996 |
| JP | 10-289979 | * | 10/1998 |
| JP | 2001-68580 | A | 3/2001 |
| JP | 2002-93920 | A | 3/2002 |
| JP | 2003-234411 | A | 8/2003 |
| JP | 2008-181990 | A | 8/2008 |
| JP | 2009-177167 | A | 8/2009 |
| JP | 2009-177168 | A | 8/2009 |
| JP | 2010-21583 | A | 1/2010 |

OTHER PUBLICATIONS

Notice of Reasons for Rejection issued Jun. 3, 2014 in Japanese Patent Application No. 2011-036186 with partial translation.

* cited by examiner

ELECTRONIC DEVICE AND METHOD FOR PRODUCING ELECTRONIC DEVICE

The contents of the following Japanese Patent Application and PCT patent application are incorporated herein by reference:

JP2010-042609 filed on Feb. 26, 2010, and
PCT/JP2011/000991 filed on Feb. 22, 2011.

BACKGROUND

1. Technical Field

The present invention relates to an electronic device and a method for producing an electronic device.

2. Related Art

For example, Patent Document 1 discloses a technique for a highly hermetical wafer-level package using a silicon wafer. This technique for a wafer-level package enables semiconductor elements to be sealed with a small thickness and into a chip size.

(Patent Document 1) Japanese Patent Application Publication No. 2001-68580

SUMMARY

Problem to be Solved by the Invention

Since a silicon wafer is not an insulator, a compound semiconductor crystal, an electrode and a wiring that are arranged directly or indirectly on the silicon wafer might cause a leakage current from the compound semiconductor crystal to the silicon wafer. Furthermore, a floating capacitance in a high-frequency range, which exists between the compound semiconductor crystal and the silicon wafer, might deteriorate the high-frequency characteristics of the signals to be input to and output from the compound semiconductor crystal.

When epitaxially growing a compound semiconductor crystal directly or indirectly on a silicon wafer, a possible method is to form directly or indirectly on the silicon wafer an inhibitor for inhibiting growth of the compound semiconductor crystal, form a small opening in the inhibitor, selectively grow a seed material of germanium or the like in the opening, and after this, grow the compound semiconductor crystal directly or indirectly on the seed material by selective epitaxial growth. When a compound semiconductor crystal is grown by selective epitaxial growth in this manner, a step is formed between the epitaxially grown compound semiconductor crystal and the inhibitor. When a wiring for connecting a region of the compound semiconductor crystal to a region of the inhibitor is formed, the formed wiring might be broken due to the step.

Means for Solving the Problem

For a solution to the above-mentioned problem, according to the first aspect related to the present invention, provided is one exemplary electronic device including: a base wafer whose surface is made of a silicon crystal; a Group 3-5 compound semiconductor crystal formed directly or indirectly on a partial region of the silicon crystal; an electronic element including a portion of the Group 3-5 compound semiconductor crystal as an active layer; an insulating film formed directly or indirectly on the base wafer and covering the electronic element; an electrode formed directly or indirectly on the insulating film; a first coupling wiring extending through the insulating film, having at least a portion thereof formed directly or indirectly on the insulating film, and electrically coupling the electronic element with the electrode; a passive element formed directly or indirectly on the insulating film; and a second coupling wiring extending through the insulating film, having at least a portion thereof formed directly or indirectly on the insulating film, and electrically coupling the electronic element with the passive element.

The electronic device may further include a sealing material formed directly or indirectly on the insulating film and sealing the electrode and the first wiring, and the electrode may extend through the sealing material to be exposed at a surface of the sealing material. The Group 3-5 compound semiconductor crystal may be formed directly or indirectly on the partial region of the silicon crystal via a seed material that alleviates a lattice mismatch between the silicon crystal and the Group 3-5 compound semiconductor crystal. The seed material has, for example, a composition of $C_xSi_yGe_zSn_{1-x-y-z}$ ($0 \le x < 1$, $0 \le y \le 1$, $0 \le z < 1$, $0 < x+y+z \le 1$). The Group 3-5 compound semiconductor crystal includes, for example, a GaAs crystal and a crystal of $Al_aGa_bIn_{1-a-b}N_cP_dAs_{1-c-d}$ ($0 \le a \le 1$, $0 \le b \le 1$, $0 \le c \le 1$, $0 \le d \le 1$, $0 \le a+b \le 1$, $0 \le c+d \le 1$) that lattice-matches or pseudo-lattice-matches with the GaAs crystal.

The electronic device may further include an inhibitor formed directly or indirectly on the base wafer, the inhibitor inhibiting growth of a compound semiconductor crystal, and the seed material may be formed in an opening that is formed in the inhibitor and leads to the base wafer. The first coupling wiring and the second coupling wiring, for example, extend from the electronic element in a direction perpendicular to a plane on which the seed material is in contact with the electronic element.

The electronic element of the electronic device is, for example, a transistor, and the transistor and the passive element form a microwave circuit. The transistor is, for example, an FET. The transistor may be a hetero bipolar transistor, and the passive element may include a resistor preventing a thermal runaway of the hetero bipolar transistor.

According to the second aspect related to the present invention, a semiconductor wafer includes: a base wafer whose surface is made of a silicon crystal; a plurality of Group 3-5 compound semiconductor crystals formed directly or indirectly on partial regions of the silicon crystal; electronic elements each including a portion of a Group 3-5 compound semiconductor crystal in some Group 3-5 compound semiconductor crystals among the plurality of Group 3-5 compound semiconductor crystals as an active layer; an insulating film formed directly or indirectly on the base wafer and covering the electronic elements; an electrode formed directly or indirectly on the insulating film; a first coupling wiring extending through the insulating film, having at least a portion thereof formed directly or indirectly on the insulating film, and electrically coupling the electronic elements with the electrode; a passive element formed directly or indirectly on the insulating film; and a second coupling wiring extending through the insulating film, having at least a portion thereof formed directly or indirectly on the insulating film, and electrically coupling the electronic elements with the passive element; wherein the some Group 3-5 compound semiconductor crystals are arranged regularly.

According to the third aspect related to the present invention, a semiconductor wafer includes: a base wafer whose surface is made of a silicon crystal; a plurality of seed materials formed directly or indirectly on partial regions of the silicon crystal; a plurality of Group 3-5 compound semiconductor crystals formed directly or indirectly on the plurality of seed materials respectively; electronic elements each including a portion of a Group 3-5 compound semiconductor crystal in some Group 3-5 compound semiconductor crystals among the plurality of Group 3-5 compound semiconductor crystals as an active layer; an insulating film formed directly or indirectly on the base wafer and covering the electronic elements; an electrode formed directly or indirectly on the insulating film; a first coupling wiring extending through the insulating film, having at least a portion thereof formed directly or indirectly on the insulating film, and electrically coupling the electronic elements with the electrode; a passive element formed directly or indirectly on the insulating film; and a second coupling wiring extending through the insulating film, having at least a portion thereof formed directly or indirectly on the insulating film, and electrically coupling the electronic elements with the passive element, wherein the seed materials are each a crystal that alleviates a lattice mismatch between the silicon crystal and the Group 3-5 compound semiconductor crystals, and the plurality of seed materials are arranged regularly.

According to the fourth aspect related to the present invention, a method for producing an electronic device includes: forming an insulating film on a base body including a seed material formed directly or indirectly on a partial region of a base wafer whose surface is made of a silicon crystal, and an electronic element formed directly or indirectly on the seed material and including a Group 3-5 compound semiconductor crystal including a layer functioning as an active layer to cover the electronic element of the base body; forming directly or indirectly on the insulating film, an electrode to be electrically coupled with the electronic element; forming directly or indirectly on the insulating film, a passive element to be electrically coupled with the electronic element; forming in the insulating film, a first via hole and a second via hole to lead to the electronic element; forming a first coupling wiring to electrically couple the electronic element with the electrode through the first via hole; and forming a second coupling wiring to electrically couple the electronic element with the passive element through the second via hole.

DESCRIPTION OF EXEMPLARY EMBODIMENTS

Figure 1:
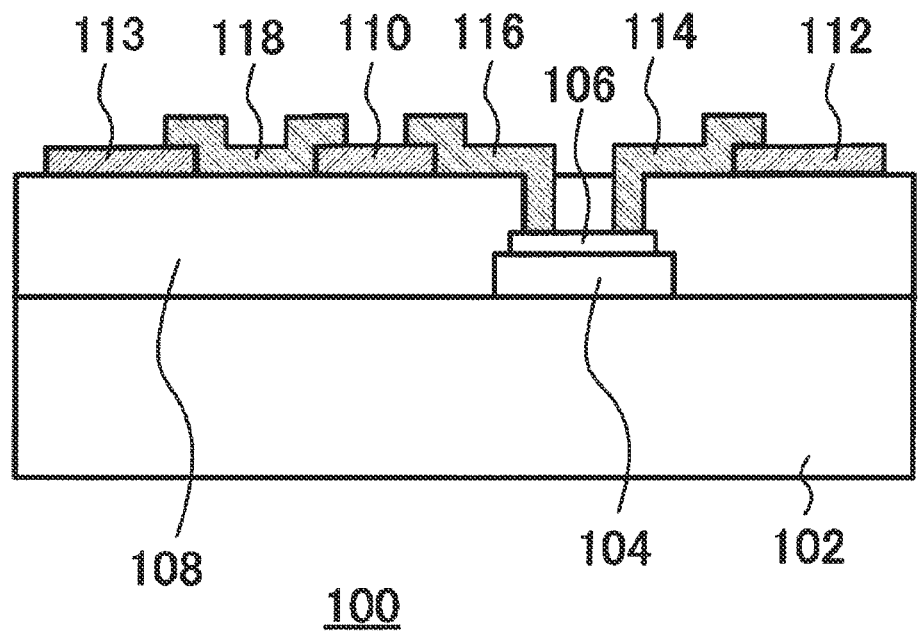
FIG. 1 shows a cross-sectional view of an electronic device 100.

The present invention will now be explained through embodiments of the invention. FIG. 1 shows a cross-sectional view of an electronic device 100. The electronic device 100 includes a base wafer 102, a Group 3-5 compound semiconductor crystal 104, an electronic element 106, an insulating film 108, a passive element 110, an electrode 112, and electrode 113, a coupling wiring 114, a coupling wiring 116, and a coupling wiring 118.

The surface of the base wafer 102 is made of a silicon crystal. The base wafer 102 is, for example, a silicon wafer or an SOI (Silicon on Insulator) whose bulk is entirely made of a silicon crystal.

The Group 3-5 compound semiconductor crystal 104 is formed directly or indirectly on a partial region of the silicon crystal. That is, the Group 3-5 compound semiconductor crystal 104 is formed directly or indirectly on the silicon crystal locally. When the Group 3-5 compound semiconductor crystal 104 is formed directly or indirectly on a partial region of the silicon crystal, annealing the formed Group 3-5 compound semiconductor crystal 104 enables its internal crystal defects to move to the periphery of the Group 3-5 compound semiconductor crystal 104, which improves the crystallinity inside the Group 3-5 compound semiconductor crystal 104. The Group 3-5 compound semiconductor crystal 104 is, for example, GaAs, AlGaAs, InGaAs, InGaP, GaP, InP, or GaN.

Here, a phrase "directly or indirectly on the silicon crystal" may represent both a case where an object is in contact with the silicon crystal and a case when an object is not in contact with the silicon crystal. That is, the electronic device 100 may include between the silicon crystal and the Group 3-5 compound semiconductor crystal 104 a substance other than the Group 3-5 compound semiconductor crystal 104.

The electronic element 106 includes a portion of the Group 3-5 compound semiconductor crystal 104 as an active layer. A region of the Group 3-5 compound semiconductor crystal 104 that does not function as the active layer of the electronic element 106 may function as a buffer layer between the base wafer 102 and the electronic element 106. The electronic element 106 is, for example, a field effect transistor, a bipolar transistor, a diode, a light emitting element, or a light receiving element. While FIG. 1 shows the Group 3-5 compound semiconductor crystal 104 and the electronic element 106 as not having any overlapping portion, this is for omitting details for simplicity of the drawing, and the electronic element 106 does include a portion of the Group 3-5 compound semiconductor crystal 104 as an active layer. This applies to the other drawings.

The insulating film 108 is formed directly or indirectly on the base wafer 102 and covers the electronic device 106. The insulating film 108 electrically insulates the electronic element 106 from the electrode 112 and the passive element 110. The insulating film 108 is, for example, silicon oxide, silicon nitride, silicon oxynitride, their fluorides, benzocyclobutene resin, liquid crystal polymer, or polyimide. The insulating film 108 covers the electronic element 106 except where the coupling wiring 114 and the coupling wiring 116 are in contact with the electronic element 106.

The passive element 110 is formed directly or indirectly on the insulating film 108 and electrically coupled with the electronic element 106 through the coupling wiring 116. The passive element 110 is, for example, a resistor, a capacitor, a coil, or a wiring. A resistor includes a metal thin film or polysilicon. A capacitor includes, for example, an insulating film, and conductive films sandwiching the insulating film. A coil includes, for example, a conductor patterned into the shape of a coil. A wiring is, for example, a metal film, or a semiconductor such as polysilicon or the like doped with an impurity at a high concentration.

The electrode 112 functions as a terminal to be electrically connected to an external circuit. The electrode 112 is formed directly or indirectly on the insulating film 108 and electrically coupled with the electronic device 106 through the coupling wiring 114. The electrode 112 is a conductor, which is made of, for example, a metal such as aluminum, copper, and tungsten, or a semiconductor doped with an impurity at a high concentration.

The coupling wiring 114 extends through the insulating film 108 and has at least a portion thereof formed directly or indirectly on the insulating film 108 to electrically couple the electronic element 106 with the electrode 112. For example, the coupling wiring 114 extends through the insulating film 108 by extending from the electronic element 106 in a direction perpendicular to the plane on which the Group 3-5 compound semiconductor crystal 104 is in contact with the electronic element 106, i.e., in the stacking direction of the Group 3-5 compound semiconductor crystal 104 and the electronic element 106. The coupling wiring 114 bends above the electronic element 106 and extends along the surface of the insulating film 108 until it reaches the electrode 112.

The coupling wiring 116 extends through the insulating film 108. The coupling wiring 116 has at least a portion thereof formed directly or indirectly on the insulating film 108 to electrically couple the electronic element 106 with the passive element 110. For example, the coupling wiring 116 extends through the insulating film 108 by extending from the electronic element 106 in a direction perpendicular to the plane on which the Group 3-5 compound semiconductor crystal 104 is in contact with the electronic element 106, i.e., in the stacking direction of the Group 3-5 compound semiconductor crystal 104 and the electronic element 106. The coupling wiring 116 bends above the electronic element 106 and extends along the surface of the insulating film 108 until it reaches the passive element 110.

The coupling wiring 118 electrically couples the passive element 110 with the electrode 113. The coupling wiring 118 is formed directly or indirectly on the surface of the insulating film 108 with which the passive element 110 and the electrode 113 are in contact.

In the electronic device 100, the coupling wiring 114 and the coupling wiring 116 extend in a direction to be away from the electronic element 106, and the regions of the coupling wiring 114 and coupling wiring 116 that extend along the surface of the insulating film 108, the passive element 110, and the electrode 112 are formed on the same plane of the insulating film 108. Therefore, even when the electronic element 106 is formed protruding from the surface of the base wafer 102, the coupling wiring 114 and the coupling wiring 116 are not formed above the step between the electronic element 106 and the surface of the base wafer 102. As a result, the possibility of the coupling wiring 114 and the coupling wiring 116 being broken is low, and reliability of the electronic device 100 is improved.

Further, since the coupling wiring 114 and the coupling wiring 116 are formed apart from the base wafer 102, the floating capacitance of the coupling wiring 114 and the coupling wiring 116 is smaller than when the coupling wiring 114 and the coupling wiring 116 are formed directly on the base wafer 102. As a result, it is possible to increase the operation speed of the electronic device 100. Moreover, since the passive element 110 is formed directly or indirectly on the insulating film 108, it is possible to increase the degree of integration of elements on the electronic device 100.

While the coupling wiring 114 and the coupling wiring 116 are connected to the electronic element 106 in FIG. 1, any other coupling wiring may be connected to the electronic component 106. For example, when the electronic element 106 is a transistor, the electronic element 106 has at least three coupling wirings.

Figure 2:
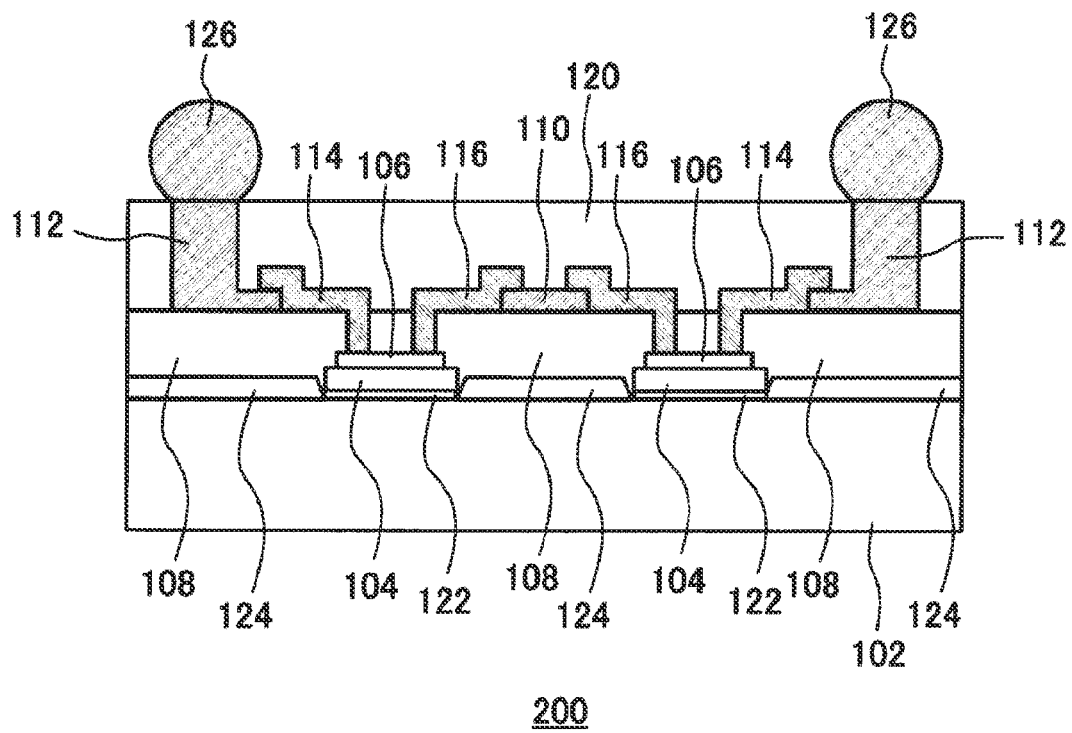
FIG. 2 shows a cross-sectional view of an electronic device 200.

FIG. 2 shows a cross-sectional view of an electronic device 200. The electronic device 200 is, for example, a semiconductor wafer formed using the space above a base wafer 102 having a standard wafer size. Here, a semiconductor wafer is a wafer having an integrated circuit including a semiconductor thin film.

Any components that are the same as the components of the electronic device 100 shown in FIG. 1 will be denoted by the same reference numerals, and will not be explained repeatedly. The electronic device 200 includes a plurality of Group 3-5 compound semiconductor crystals 104 formed directly or indirectly on partial regions of the silicon crystal of which the surface of a base wafer 102 is made. Electronic elements 106 each include a portion of a Group 3-5 compound semiconductor crystal 104 in some Group 3-5 compound semiconductor crystals 104 among the plurality of Group 3-5 compound semiconductor crystals 104 as an active layer.

The some Group 3-5 compound semiconductor crystals 104 are arranged regularly. For example, the some Group 3-5 compound semiconductor crystals 104 are disposed in cyclically repetitive patterns. In the individual cyclically repetitive patterns, the plurality of Group 3-5 compound semiconductor crystals 104 are arranged at the same arrangement.

The some Group 3-5 compound semiconductor crystals 104 may be arranged in cyclically repetitive patterns having a rotation symmetry. That is, the Group 3-5 compound semiconductor crystals 104 may be arranged at such positions on the circumference of a circle centered at a reference position on the base wafer 102 as shifted by a regular rotation angle.

For example, the plurality of Group 3-5 compound semiconductor crystals 104 are arranged at 180-degree, 120-degree, 90-degree, or 60-degree rotations. The plurality of Group 3-5 compound semiconductor crystals 104 may be arranged at 72-degree, 45-degree, 36-degree, or 30-degree rotations. The plurality of Group 3-5 compound semiconductor crystals 104 may be arranged in a Penrose tiles arrangement composed of rhomboids with an acute angle of 72 degrees and an obtuse angle of 108 degree and rhomboids with an acute angle of 36 degrees and an obtuse angle of 144 degrees.

For example, the plurality of Group 3-5 compound semiconductor crystals 104 are arranged in a lattice arrangement. The plurality of Group 3-5 compound semiconductor crystals 104 may be arranged at equal intervals. For example, the center points or the reference positions of the plurality of Group 3-5 compound semiconductor crystals 104 may be arranged in line in a first direction and also in line in a second direction perpendicular to the first direction.

By arranging the plurality of Group 3-5 compound semiconductor crystals 104 in a plurality of cyclically repetitive arrangement patterns, it is possible to improve the degree of arbitrariness in designing the arrangement of the Group 3-5 compound semiconductor crystals 104 and facilitate the control on the epitaxial growth conditions. For example, it is possible to control the epitaxial growth conditions so as to form equal groups of a plurality of electronic elements 106 directly or indirectly on the base wafer 102 such that in each group, the electronic elements 106 are formed directly or indirectly on only some Group 3-5 compound semiconductor crystals 104 among the plurality of Group 3-5 compound semiconductor crystals 104 and no electronic elements 106 are formed directly or indirectly on the other Group 3-5 compound semiconductor crystals 104.

By cutting the electronic device 200, it is possible to produce a plurality of electronic devices including the electronic elements 106. For example, the electronic device 200 is cut at the boundary between the cyclically repetitive arrangement patterns composed of a plurality of electronic elements 106.

The electronic device 200 includes a sealing material 120 formed directly or indirectly on the insulating film 108. Electrodes 112, for example, extend through the sealing material 120 to be exposed at the surface of the sealing material 120. The sealing material 120 is, for example, epoxy resin, benzocyclobutene resin, liquid crystal polymer, or polyimide. A ball bump 126 may be formed directly or indirectly on each electrode 112. The ball bump 126 are in contact with the electrode 112 formed directly or indirectly on the surface of the sealing material 120.

The electronic device 200 may include seed materials 122 between the base wafer 102 and the Group 3-5 compound semiconductor crystals 104. The seed materials 122 alleviate any lattice mismatch between the silicon crystal of which the surface of the base wafer 102 is made and the Group 3-5 compound semiconductor crystals 104. The seed materials 122 may be $C_xSi_yGe_zSn_{1-x-y}$ ($0 \leq x < 1$, $0 \leq y \leq 1$, $0 \leq z < 1$, $0 < x+y+z \leq 1$). The Group 3-5 compound semiconductor crystals 104 may be a crystal of $Al_aGa_bIn_{1-a-b}N_cP_dAs_{1-c-d}$ ($0 \leq a \leq 1$, $0 \leq b \leq 1$, $0 \leq c \leq 1$, $0 \leq d \leq 1$, $0 \leq a+b \leq 1$, $0 \leq c+d \leq 1$) that lattice-matches or pseudo-lattice-matches with GaAs.

As shown in FIG. 2, the electronic device 200 may include an inhibitor 124 formed directly or indirectly on the base wafer 102. The inhibitor 124 inhibits growth of a compound semiconductor crystal. The inhibitor 124 has openings that lead to the base wafer 102, and the seed materials 122 are formed in the openings of the inhibitor 124. By forming openings in the inhibitor 124, it is possible to grow Group 3-5 compound semiconductor crystals 104 at the positions of the openings by selective epitaxial growth.

When the electronic elements 106 are transistors, the transistors and the passive element 110 may form a microwave circuit. In this case, the transistors are preferably FETs (Field Effect Transistors). The FETs may be, for example, heterostructure FETs having a GaAs channel, a GaN channel, or an InGaAs channel.

The transistors may be hetero bipolar transistors. In this case, it is preferable that the passive element 110 include a resistor, and the resistor have a ballast function for preventing a thermal runaway of the hetero bipolar transistors. The hetero bipolar transistors may be hetero bipolar transistors including an InGaP emitter or an AlGaAs emitter, a GaAs base, and a GaAs collector.

Figure 3:
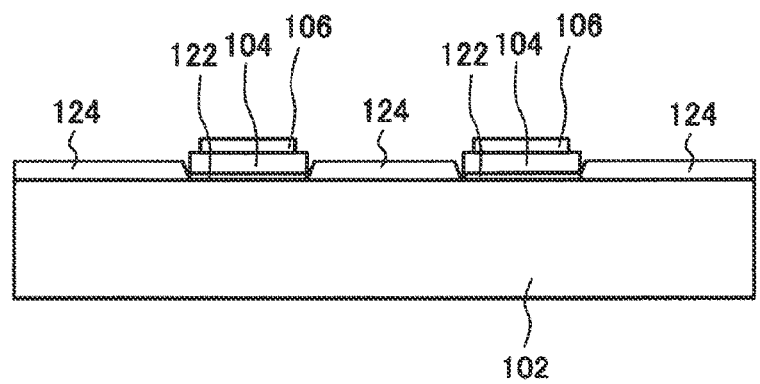
FIG. 3 shows a cross-sectional view of the electronic device 200 during a production process.
Figure 4:
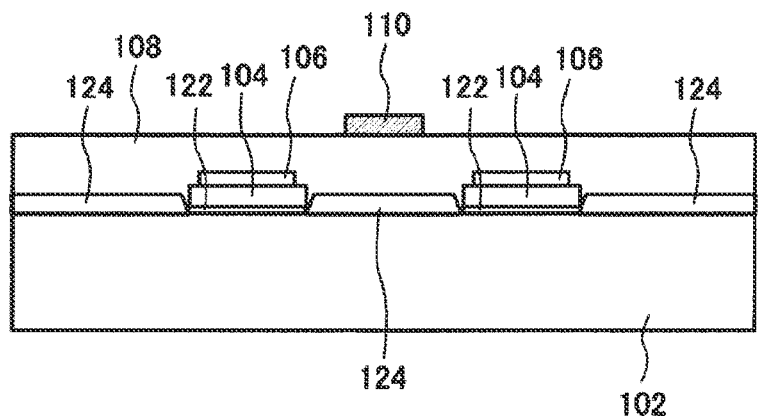
FIG. 4 shows a cross-sectional view of the electronic device 200 during a production process.
Figure 5:
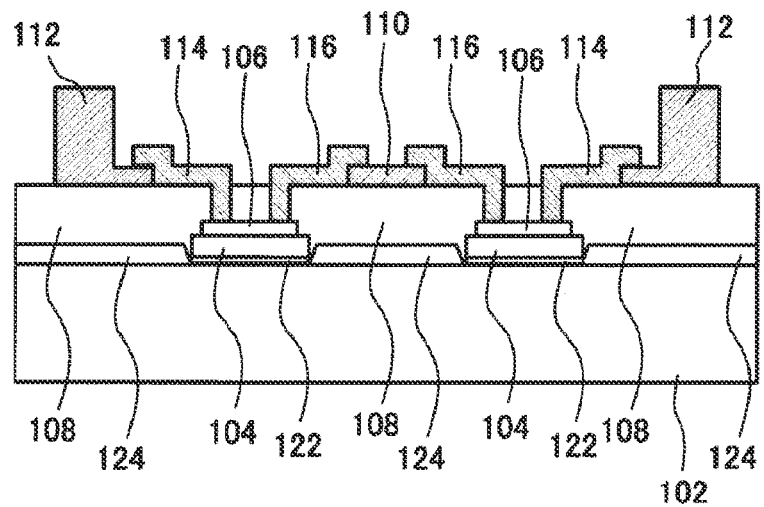
FIG. 5 shows a cross-sectional view of the electronic device 200 during a production process.

FIG. 3 to FIG. 5 show cross-sectional views of the electronic device 200 during a production process. First, as shown in FIG. 3, seed materials 122 to be formed directly or indirectly on partial regions of the base wafer 102 whose surface is made of silicon crystal, and electronic elements 106 to each include as an active layer, a portion of a Group 3-5 compound semiconductor crystal 104 to be formed directly or indirectly on any of the seed materials 122 are formed directly or indirectly on the base wafer 102. Next, as shown in FIG. 4, an insulating film 108 to cover the electronic elements 106 is formed. Then, a passive element 110 is formed directly or indirectly on the insulating film 108.

Then, as shown in FIG. 5, electrodes 112 for external connection are formed directly or indirectly on the insulating film 108. Next, via holes to extend through the insulating film 108 to lead to the electronic elements 106 are formed in the insulating film 108. Specifically, via holes corresponding to the coupling wirings 116 to electrically couple the electronic elements 106 with the passive element 110 and via holes corresponding to the coupling wirings 114 to electrically couple the electronic elements 106 with the electrodes 112 are formed.

Next, each via hole is filled with a conductor. For example, the via holes are filled with a conductor by applying a conductive paste into the via holes in the surface of the insulating film 108. Then, the coupling wirings 116 to electrically couple the electronic elements 106 with the passive element 110 through the conductor and the coupling wirings 114 to electrically couple the electronic elements 106 with the electrodes 112 through the conductor are formed. The coupling wirings 114 and the coupling wirings 116 including the conductor in the via holes may be formed by using a dual damascene process.

According to the electronic device 200, even if the presence of the inhibitor 124, which is provided for forming the Group 3-5 compound semiconductor crystals 104 directly or indirectly on the base wafer 102, produces clearances between the Group 3-5 compound semiconductor crystals 104 and the inhibitor 124, no coupling wirings are disposed above the clearances. Hence, it is possible to prevent breaking of coupling wirings due to any steps in the clearances.

Further, in the electronic device 200, ball bumps 126 to be in contact with the surface of the sealing material 120 are provided. The ball bumps 126 are in contact with the surface of the sealing material 120 and electrically coupled with the electronic elements 106 through the electrodes 112 and the coupling wirings 114. Since the electronic device 200 has a shape suitable for surface mounting with the ball bumps 126 provided on the plane of the sealing material 120, the use of the electronic device 200 enables high-density mounting of electronic circuits.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An electronic device, comprising:

a base wafer whose surface is made of a silicon crystal;

a Group 3-5 compound semiconductor crystal formed directly or indirectly on a partial region of the silicon crystal;

an electronic element including a portion of the Group 3-5 compound semiconductor crystal as an active layer;

an insulating film formed directly or indirectly on the base wafer and covering the electronic element;

an electrode formed directly or indirectly on the insulating film;

a first coupling wiring extending through the insulating film, having at least a portion thereof formed directly or indirectly on the insulating film, and electrically coupling the electronic element with the electrode;

a passive element formed directly or indirectly on the insulating film; and a second coupling wiring extending through the insulating film, having at least a portion thereof formed directly or indirectly on the insulating film, and electrically coupling the electronic element with the passive element wherein the Group 3-5 compound semiconductor crystal is formed directly or indirectly on the partial region of the silicon crystal via a seed material that alleviates a lattice mismatch between the silicon crystal and the Group 3-5 compound semiconductor crystal, wherein the seed material has a composition of $C_xSi_yGe_zSn_{1-x-y-z}$ ($0 \leq x < 1$, $0 \leq y \leq 1$, $0 \leq z < 1$, $0 < x+y+z \leq 1$).

2. The electronic device according to claim 1, further comprising
a sealing material formed directly or indirectly on the insulating film and sealing the electrode and the first coupling wiring,
wherein the electrode extends through the sealing material to be exposed at a surface of the sealing material.

3. The electronic device according to claim 1,
wherein the Group 3-5 compound semiconductor crystal includes a GaAs crystal and a crystal of $Al_aGa_bIn_{1-a-b}N_cP_dAs_{1-c-d}$ ($0 \leq a \leq 1$, $0 \leq b \leq 1$, $0 \leq c \leq 1$, $0 \leq d \leq 1$, $0 \leq a+b \leq 1$, $0 \leq c+d \leq 1$) that lattice-matches or pseudo-lattice-matches with the GaAs crystal.

4. The electronic device according to claim 1, further comprising
an inhibitor formed directly or indirectly on the base wafer, the inhibitor inhibiting growth of a compound semiconductor crystal,
wherein the seed material is formed in an opening that is formed in the inhibitor and leads to the base wafer.

5. The electronic device according to claim 1,
wherein the electronic element consists of a transistor, and the transistor and the passive element form a microwave circuit.

6. The electronic device according to claim 5,
wherein the transistor is an FET.

7. The electronic device according to claim 5,
wherein the transistor is a hetero bipolar transistor, and the passive element includes a resistor preventing a thermal runaway of the hetero bipolar transistor.

8. The electronic device according to claim 1,
wherein the first coupling wiring and the second coupling wiring extend from the electronic element in a direction perpendicular to a plane on which the seed material is in contact with the electronic element.

9. A semiconductor wafer, comprising:
a base wafer whose surface is made of a silicon crystal;
a plurality of seed materials formed directly or indirectly on partial regions of the silicon crystal;
a plurality of Group 3-5 compound semiconductor crystals formed directly or indirectly on the plurality of seed materials respectively;
a plurality of electronic elements each including, as an active layer, a portion of a Group 3-5 compound semiconductor crystal from among the plurality of Group 3-5 compound semiconductor crystals;
an insulating film formed directly or indirectly on the base wafer and covering the electronic elements;
an electrode formed directly or indirectly on the insulating film;
a first coupling wiring extending through the insulating film, having at least a portion thereof formed directly or indirectly on the insulating film, and electrically coupling an electronic element from among the plurality of electronic elements with the electrode;
a passive element formed directly or indirectly on the insulating film; and
a second coupling wiring extending through the insulating film, having at least a portion thereof formed directly or indirectly on the insulating film, and electrically coupling an electronic element from among the plurality of electronic elements with the passive element,
wherein the seed materials are each a crystal that alleviates a lattice mismatch between the silicon crystal and the Group 3-5 compound semiconductor crystals, and
the plurality of seed materials are arranged regularly, and the seed material each have a composition of $C_xSi_yGe_zSn_{1-x-y-z}$ ($0 \leq x < 1$, $0 \leq y \leq 1$, $0 \leq z < 1$, $0 < x+y+z \leq 1$).

* * * * *